United States Patent
Yamamoto et al.

(10) Patent No.: US 10,355,441 B2
(45) Date of Patent: Jul. 16, 2019

(54) LASER MODULE AND LASER PROCESSING APPARATUS

(71) Applicants: Mitsubishi Electric Corporation, Chiyoda-ku (JP); Kyoto University, Kyoto-shi (JP); HAMAMATSU PHOTONICS K.K., Hamamatsu-shi (JP); ROHM CO., LTD., Kyoto-shi (JP)

(72) Inventors: Tatsuya Yamamoto, Chiyoda-ku (JP); Kazuki Kuba, Chiyoda-ku (JP); Masato Kawasaki, Chiyoda-ku (JP); Yoko Inoue, Chiyoda-ku (JP); Tetsuo Kojima, Chiyoda-ku (JP); Junichi Nishimae, Chiyoda-ku (JP); Susumu Noda, Kyoto (JP)

(73) Assignees: MITSUBISHI ELECTRIC CORPORATION, Chiyoda-ku (JP); KYOTO UNIVERSITY, Kyoto-shi (JP); HAMAMATSU PHOTONICS KK., Hamamatsu-shi (JP); ROHM CO., LTD., Kyoto-shi (JP)

( * ) Notice: Subject to any disclaimer, the term of this patent is extended or adjusted under 35 U.S.C. 154(b) by 0 days.

(21) Appl. No.: 15/570,856

(22) PCT Filed: Apr. 7, 2016

(86) PCT No.: PCT/JP2016/061455
§ 371 (c)(1),
(2) Date: Oct. 31, 2017

(87) PCT Pub. No.: WO2016/189983
PCT Pub. Date: Dec. 1, 2016

(65) Prior Publication Data
US 2018/0348451 A1    Dec. 6, 2018

(30) Foreign Application Priority Data

May 27, 2015  (JP) .................. 2015-107329

(51) Int. Cl.
*H01S 5/00* (2006.01)
*G02B 6/42* (2006.01)
(Continued)

(52) U.S. Cl.
CPC ............... *H01S 5/005* (2013.01); *G02B 6/42* (2013.01); *G02B 6/425* (2013.01); *G02B 6/4206* (2013.01);
(Continued)

(58) Field of Classification Search
CPC ...... G02B 6/42; G02B 6/4204; G02B 6/4206; G02B 6/425; H01S 5/005; H01S 5/02284;
(Continued)

(56) References Cited

U.S. PATENT DOCUMENTS

2002/0090172 A1  7/2002  Okazaki et al.
2009/0285255 A1  11/2009  Sakai et al.
(Continued)

FOREIGN PATENT DOCUMENTS

JP    5-224099 A    9/1993
JP    2848279 B    1/1997
(Continued)

OTHER PUBLICATIONS

International Search Report dated Jul. 5, 2016 in PCT/JP2016/061455, filed on Apr. 7, 2016.
(Continued)

*Primary Examiner* — Armando Rodriguez
(74) *Attorney, Agent, or Firm* — Oblon, McClelland, Maier & Neustadt, L.L.P.

(57) ABSTRACT

A laser module includes: a photonic crystal surface-emitting laser element; a collimating lens array for producing a
(Continued)

parallel optical beam; a condenser lens for condensing the optical beam; and an optical fiber which receives the optical beam on one end and transmits the optical beam to the outside. In the collimating lens array, an aperture portion corresponding to a collimating lens allows passage of the optical beam with an energy of not less than 94.0% and not more than 99.5% with respect to 100% of the energy of the optical beam incident on the collimating lens array.

14 Claims, 14 Drawing Sheets

(51) Int. Cl.
  *H01S 5/022* (2006.01)
  *H01S 5/10* (2006.01)
  *H01S 5/18* (2006.01)
  *H01S 5/42* (2006.01)
  *H01S 5/40* (2006.01)
(52) U.S. Cl.
  CPC .......... *H01S 5/02284* (2013.01); *H01S 5/105* (2013.01); *H01S 5/18* (2013.01); *H01S 5/42* (2013.01); *H01S 5/4012* (2013.01)

(58) Field of Classification Search
  CPC ... H01S 5/105; H01S 5/18; H01S 5/42; H01S 5/4012
  See application file for complete search history.

(56) References Cited

U.S. PATENT DOCUMENTS

| | | | |
|---|---|---|---|
| 2012/0281293 | A1 | 11/2012 | Gronenborn et al. |
| 2015/0380894 | A1 | 12/2015 | Yoshino et al. |

FOREIGN PATENT DOCUMENTS

| | | | |
|---|---|---|---|
| JP | 2002-202442 | A | 7/2002 |
| JP | 2007-248581 | A | 9/2007 |
| JP | 2007-258262 | A | 10/2007 |
| JP | 2013-502717 | A | 1/2013 |
| JP | 2014-175626 | A | 9/2014 |

OTHER PUBLICATIONS

Chinese Office Action dated Jan. 3. 2019 in Chinese Patent Application No. 2016-80030650.8 with computer-generated translation.

(1/e² BEAM WIDTH ON COLLIMATING LENS ARRAY / APERTURE RADIUS OF COLLIMATING LENS ARRAY)

LASER MODULE AND LASER PROCESSING APPARATUS

TECHNICAL FIELD

The present invention relates to a laser module equipped with a plurality of surface-emitting laser elements, and a laser processing apparatus that utilizes the laser module.

BACKGROUND ART

Conventional laser modules are equipped with a plurality of laser elements (i.e. semiconductor laser elements), a collimating lens array (or a plurality of collimating lenses), a condenser lens, and an optical fiber. Light beams emitted from the laser elements are collimating by the collimating lens array, converged by the condenser lens, and coupled to the optical fiber. The power output of the laser module is thus increased by the use of a plurality of laser elements, resulting in the increase of the brightness of the light beam emitted from the fiber. The laser modules disclosed in Patent Documents 1 and 2 utilize surface-emitting laser elements as the laser elements.

PRIOR ART DOCUMENTS

Patent Documents

Patent Document 1: JP 2007-248581 A (Lines 1-8 and 29-31 on Page 12 and FIG. 18)
Patent Document 2: Japanese Patent No. 2848279 (Paragraphs [0010] to [0012] on page 2 and FIG. 1)

SUMMARY OF THE INVENTION

Problems to be Solved by the Invention

In order to increase the brightness of the light beam emitted from the fiber, it is required to improve the convergence of the light beam emitted from the fiber in addition to an increase in the power output of the laser module.

When a plurality of light beams are coupled to one optical fiber, the convergence of the light beam emitted from the fiber gets lower in the case where the collimated light beams passing through the collimating lens array do not contact with each other, as compared to the case where the light beams contact with each other. Therefore, in order to increase the convergence of the light beam emitted from the fiber, it is preferable to make the light beams passing through the collimating lens array contact with each other.

In the laser modules disclosed in Patent Documents 1 and 2, however, the apertures formed in the collimating lens array through which the light beams pass are largely spaced apart from each other for the passing light beams to contact with each other, reducing the convergence of the light beam emitted from the fiber. Namely, in Patent Documents 1 and 2, consideration is not given enough on the improvement of convergence of the light beam emitted from the fiber.

The present invention is aimed at solving the problem described above. It is an object of the present invention to provide a laser module with a brightness of light beams after being emitted from a fiber higher than that of conventional lasers.

Means for Solving the Problems

A laser module according to the present invention includes: a plurality of photonic crystal surface-emitting laser elements arranged on a coplanar surface and each emitting a light beam; a collimating lens array having a plurality of apertures that form collimating lenses to collimate the light beams emitted from the plurality of photonic crystal surface-emitting laser elements; a condenser lens configured to converge the light beams collimated by the collimating lens array; and an optical fiber receiving light beams converged by the condenser lens at one end and transferring the light beams to outside.

In one aspect of the present invention, the apertures of the collimating lens array are designed to pass light beams in an energy range of from 94.0% to 99.5% inclusive of 100% energy of a light beam incident on the collimating lens array.

In one aspect of the present invention, the apertures of the collimating lens array have a size ranging from 0.6 times to 0.85 times inclusive a Gaussian beam radius of a light beam input in the apertures.

Effects of the Invention

According to the present invention, a laser module with a brightness of light beams after being emitted from a fiber higher than that of conventional lasers can be provided.

EMBODIMENTS OF THE INVENTION

Hereinafter, embodiments of the present invention will be described with reference to the drawings. Same or similar features are given the same reference signs in each drawing.

Embodiment 1

[Overall Configuration]

Figure 1:
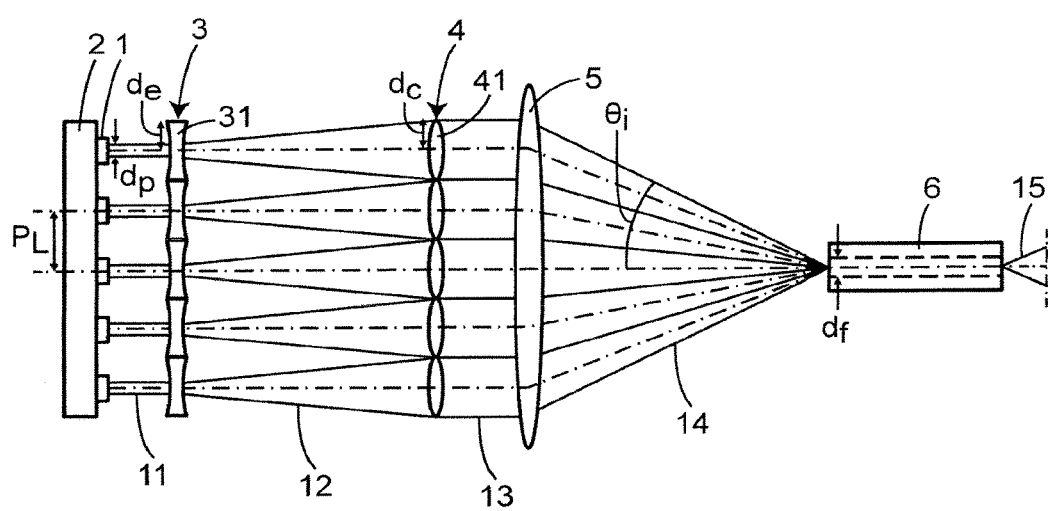
FIG. 1 is a diagram illustrating a configuration of a laser module according to Embodiment 1 of the present invention.

FIG. 1 is a diagram illustrating a configuration of a laser module 10 according to Embodiment 1 of the present invention.

The laser module 10 includes a plurality of laser elements 1, a concave lens array 3, a collimating lens array 4, a condenser lens 5, and an optical fiber 6, and is configured to couple the light beams (or laser beams) emitted from the laser elements 1 to the optical fiber 6. The laser module 10 may be mounted on amount component (not illustrated). While one example will be described below in which the laser module 10 is used for material processing (such as cutting process, or welding, of metal, glass, carbon fiber-reinforced plastic (CFRP), resin, etc.), the laser module may be used in other applications such as optical communication.

In FIG. 1, reference signs 11, 12, 13, 14, and 15 are each given to a light beam output from the laser element 1 and incident on incident on the concave lens array 3, a light beam having passed through the concave lens array 3 and incident on the collimating lens array 4, a light beam having passed through the collimating lens array 4 and incident on the condenser lens 5, a light beam having passed through the condenser lens 5 and incident on the optical fiber 6, and a light beam output from the optical fiber 6. It should be noted that, these reference signs are given in view of formality and light beams with the same reference signs may change in beam width, etc. as they travels.

The laser elements 1 are mounted on a main surface (coplanar surface) of a base 2 and each of the laser elements 1 is configured to emit a light beam 11. The laser elements 1 are surface-emitting laser elements that emit light beams in in a direction perpendicular to the substrate surface. The laser elements 1 may be photonic crystal surface-emitting lasers (PCSEL), which will be described later. The base 2 has a plate-like shape, and may include a cooling mechanism for cooling the laser elements and a power circuit for supplying power to the laser elements. The laser elements 1 are arranged in a hexagonal lattice pattern as illustrated in FIG. 2.

Figure 2:
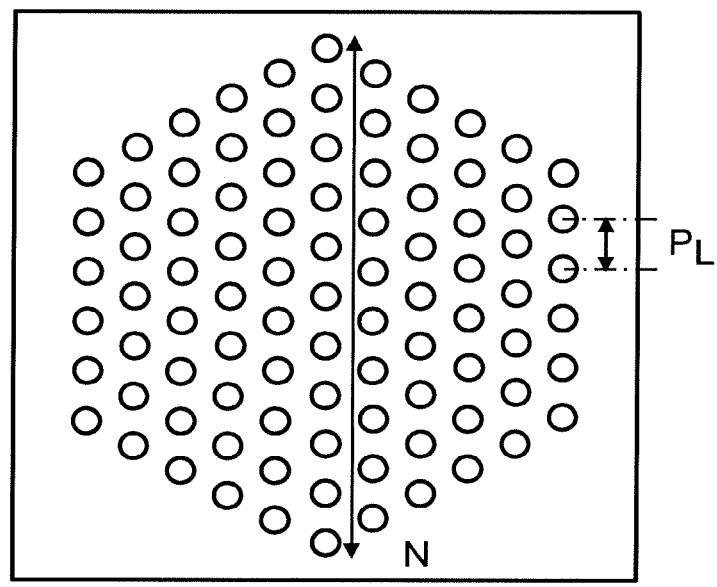
FIG. 2 is a diagram illustrating a plurality of laser elements viewed from a direction in which light beams are emitted.

It should be noted that, FIG. 2 schematically illustrates the arrangement of laser elements 1 and hence the shape, number, and arrangement pitch of the laser elements 1 are not limited to the depicted ones. For example, while the laser elements 1 are depicted as having a circular shape in FIG. 2, they may have other shapes such as rectangular, hexagonal, etc. While in FIG. 2, the laser elements 1 are two-dimensionally arranged, alternately they may be one-dimensionally arranged.

The concave lens array 3 is disposed immediately after the laser elements 1 and functions to enlarge the beam width of the light beam 11 emitted from each of the laser elements 1. The concave lens array 3 forms a beam expander together with the collimating lens array 4. The concave lens array 3 includes a plurality of concave lenses provided therein, each of which corresponds to each of the laser elements 1 so as to each coaxially receive the light beam 11 emitted from each of the laser elements 1. Areas of the concave lens array 3 that allow light beams 11 to pass through and thus form concave lenses will be referred to as apertures 31. The remaining areas other than the apertures 31 on the concave lens array 3 that do not allow the light beams 11 to pass through while cause diffraction and reflection (hereinafter referred to as diffraction and the like) will be referred to as non-aperture areas. The apertures 31 are arranged in a hexagonal lattice pattern corresponding to the hexagonal lattice arrangement of the plurality of laser elements 1.

In Embodiment 1, it is preferable to provide the concave lens array 3 such that the distance between the laser elements 1 and the collimating lens array 4 may be reduced, thereby reducing the size of the laser module 10. However, the concave lens array 3 is not an essential element in this embodiment. Namely, the laser module may be configured such that the light beams 11 emitted from the laser elements 1 are directly incident on the collimating lens array 4.

If PCSEL elements are to be used as the laser elements 1, it is advantageous to use the concave lens array 3 for the following reason: Photonic crystal surface-emitting lasers are operable to emit light beams with a small divergence angle (i.e., light beams with a good-quality). It means that the beam width is to expand to a less extent as the light beams propagate. In Embodiment 1, as will be described later, the beam width is optimized at the position where the collimating lens array 4 is located. Increasing the diameter of the light beams emitted from the laser elements 1 by means of the concave lens array 3 enables the optimization of the beam width with a smaller distance from the laser elements 1 to the collimating lens array 4.

The collimating lens array 4 is configured to convert the light beams 12 that have passed through the concave lens array 3 into the light beams 13 that are parallel (or substantially parallel) to each other. The collimating lens array 4 may be a convex lens array. The collimating lens array 4 is provided with a plurality of collimating lenses, each of which corresponds to each of the laser elements 1 (and the apertures 31 of the concave lens array 3) so as to each coaxially receive the light beam 12. Areas of the collimating lens array 4 that allows the light beam to pass through and thus form collimating lenses will be referred to as apertures 41. The remaining areas other than the apertures on the collimating lens array 4 that do not allow the light beam to pass through while cause diffraction and the like will be referred to as non-aperture areas.

The apertures 41 are arranged in a hexagonal close-packed pattern on a plane corresponding to the hexagonal lattice arrangement of the plurality of laser elements 1. Namely, the apertures 41 are arranged adjacent each other. In this example, the distance between centers of the apertures 41 equals to twice the radius of the apertures 41 (i.e. aperture size of the collimating lens array 4). The collimating lens array 4 is positioned such that the parallel and adjacent light beams 13 that have passed through the apertures 41 are in contact (or in substantially contact) with each other.

Generally, the beam width of a light beam may be defined as half a width on an intensity distribution at a location where the radiant intensity curve of the light beam has a level of $1/e^2$ (about 13.5%) of a peak value (or a value on the optical axis) in a plane perpendicular to the optical axis. The beam width thus defined may be referred to as Gaussian beam radius herein. The "beam width" referred to in the embodiments of the present invention is not limited to the size thus defined and may be modified in accordance with the desired energy cut-off rate of the light beam.

The condenser lens 5 is configured to converge the plurality of light beams 13 that have passed through the collimating lens array 4 toward the incident end (i.e. the incident end of the core of) the optical fiber 6. The condenser lens 5 may be a convex lens. As mentioned above, the adjacent light beams 13 that have passed through the collimating lens array 4 contact with each other, so that the light beams 14 that have passed through the condenser lens 5 adjacent each other are also in contact with each other to be incident on the incident end of the optical fiber 6. As such, the convergence of the light beam 15 emitted from the fiber is improved.

The plurality of light beams 14 incident on the optical fiber 6 travel through the core of the optical fiber 6 and then coupled into a single light beam. A high-power light beam 15 is thus output from the exit end of the optical fiber 6.

Since the light beam is transferred to outside using the optical fiber 6, a complex beam transfer optical system is may be omitted, which is advantageous in various applications. Moreover, the intensity distribution before the coupling to the fiber obtains uniformity in the process of transfer through the fiber, so that the beam quality can be enhanced. In particular, the rotational symmetry of the light beam, which is an important element in two-dimensional laser processing, is achieved by the fiber transmission.

[PCSEL Element]

Hereinafter, the PCSEL element, which is one example of the laser element 1, will be described. The PCSEL element is a surface-emitting type semiconductor laser element that has a photonic crystal structure with a period of the order of optical wavelength near active layers, and can emit uniform coherent light. The wavelength of the light beam output from a PCSEL element can be controlled by the adjustment of the semiconductor material used for the fabrication of the PCSEL element and the period of the photonic crystal structure.

One specific issue associated with conventional laser diodes is that the transverse mode of an emitted beam changes in accordance with the area of the light-emitting surface, and that as the light-emitting surface gets increased so as to raise the output power, the convergence of the light beam gets decreased. In contrast, it is known that PCSEL elements can output high power laser light while maintaining a high convergence with increased light-emitting surface. In the longitudinal mode, while conventional laser diodes are operable to emit a light beam containing wavelengths in a certain range in accordance with the gain width of the active layer, PCSEL elements are operable to emit only a light beam of a single wavelength defined by a lattice constant of the photonic crystal.

Figure 3:
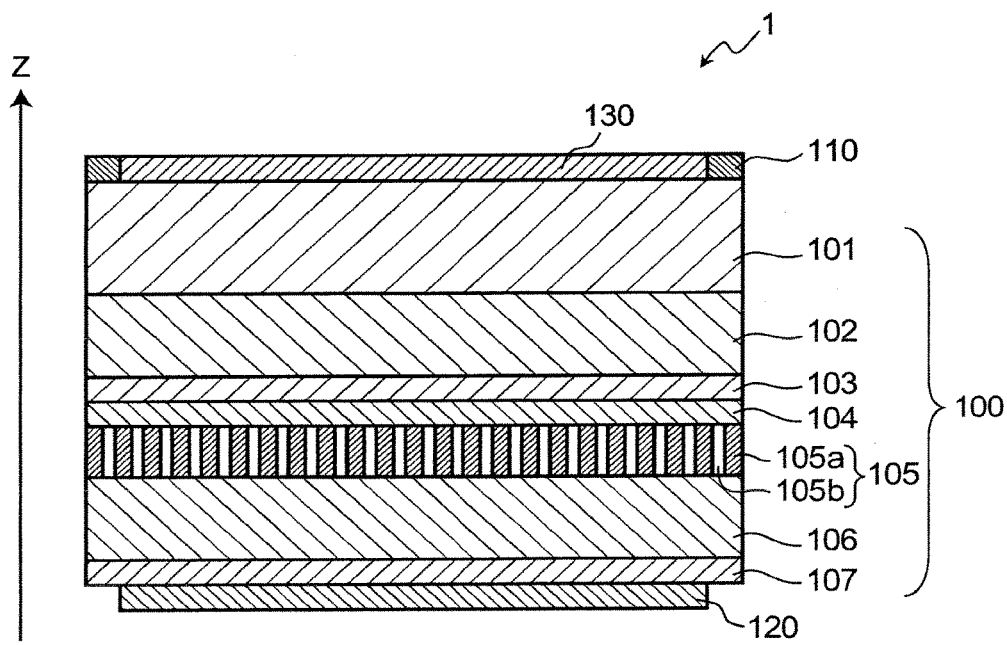
FIG. 3 is a cross-sectional view illustrating a exemplary structure of a PCSEL element.

FIG. 3 is a cross-sectional view illustrating an exemplary structure of a PCSEL element. In FIG. 3, the direction in which the light beam is emitted is defined as direction z, and the positive side of z is referred to as the front side, and the negative side as the backside. GaAs (gallium arsenide) may be used for the material of a stack 100. The PCSEL element includes the stack 100, a window electrode 110 provided on the surface of the stack 100, a backside electrode 120 provided on the backside of the stack 100, and an AR (anti reflection) coat (non-reflective coat) layer 130 provided in a window formed by the window electrode 110. This window forms an emission surface (light-emitting surface) of the light beam.

The stack 100 includes a substrate 101, n-type clad layer 102, an active layer 103, a carrier block layer 104, a photonic crystal layer 105, a p-type clad layer 106, and a p-type contact layer 107. The carrier block layer 104 is an undoped layer. In the photonic crystal layer 105, holes 105b are formed in a slab layer denoted by reference sign 105a. The lattice pattern of the photonic crystal layer 105 may have any shape such as square shape, triangular shape, orthogonal shape, etc.

In the structure of the PCSEL element described above, the active layer 103, the carrier block layer 104, and the photonic crystal layer 105 may be arranged in the reverse order.

When a bias voltage is applied across the window electrode 110 and the backside electrode 120, the active layer 103 emits light, which is modulated by the photonic crystal layer 105, and released in the form of a laser beam in a direction vertical to the substrate surface (direction z).

The laser oscillation wavelength is determined in accordance with the material and period of the photonic crystal. GaAs used for the photonic crystal layer 105 of the POSEL element has a refraction index of about 3.5, while the refraction index in the holes (air) is 1. Considering the volume occupied by the holes 105b (16%) and the stacked structure of the PCSEL element, the effective refraction index near the active layer 103 is about 3.3. The period of the photonic crystal then is 980 nm/3.3≈295 nm. This period may vary in accordance with the stack structure etc. of the stack 100.

An exemplary method for producing the PCSEL element (including steps S1 to S4) will be simply described.

(S1) The n-type clad layer 102, the active layer 103, the carrier block layer 104, and the slab layer 105a are epitaxially grown via a metalorganic chemical vapor deposition (MOCVD) method, for example, on the backside of the substrate 101.

(S2) A resist is patterned on the slab layer 105a, and the slab layer 105a is etched via reactive ion etching (RIE, for example, to provide the holes 105b. The photonic crystal layer 105 is thus formed.

(S3) The p-type clad layer 106 and the p-type contact layer 107 are epitaxially regrown by a metalorganic chemical vapor deposition method, for example, on the backside of the photonic crystal layer 105.

(S4) The window electrode 110 is provided on the surface of the n-type clad layer 102, and the backside electrode 120 is provided on the backside of the p-type contact layer 107, each via deposition process.

Figure 4A:
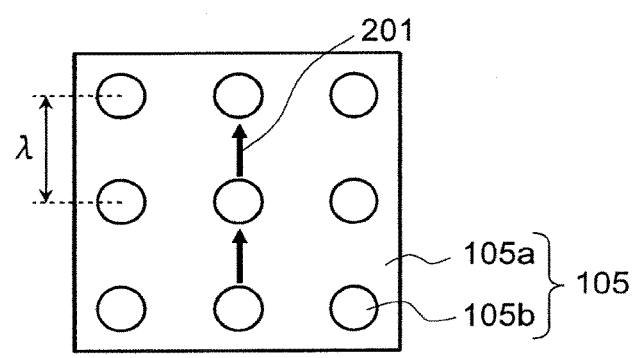
FIG. 4A is a diagram illustrating the behavior of light inside a photonic crystal layer.
Figure 4B:
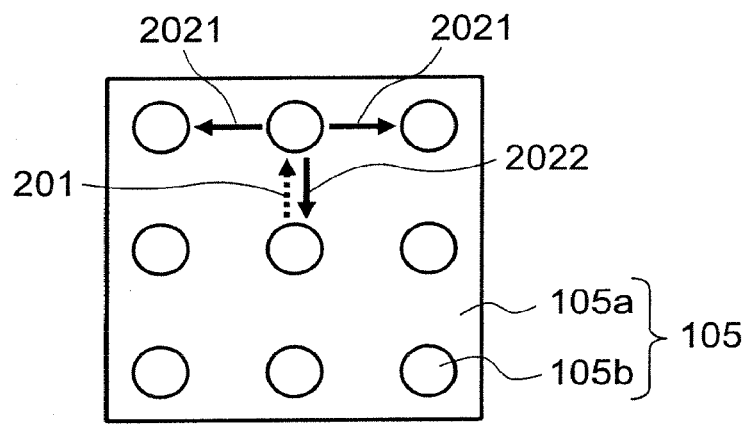
FIG. 4B is a diagram illustrating the behavior of light inside a photonic crystal layer.
Figure 4C:
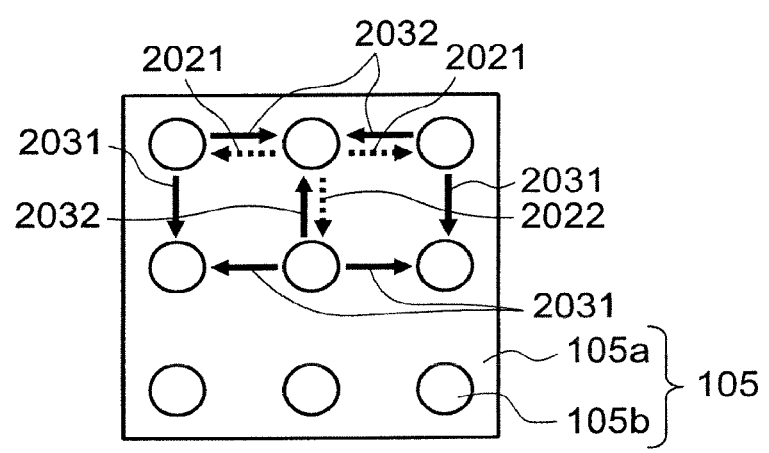
FIG. 4C is a diagram illustrating the behavior of light inside a photonic crystal layer.

Referring to FIGS. 4A to 4C and FIGS. 5A and 5B that show the behaviors of light inside the photonic crystal, the principle of how PCSEL operates as a surface-emitting laser light source will be explained. FIGS. 4A to 4C are top views of the photonic crystal layer 105. The holes 105b are depicted as having a true circle shape (or substantially true circle shape) in FIGS. 4A to 4C for illustrative purposes. The photonic crystal layer 105 is located close to the active layer 103 so that it has a restrictive effect on the light generated in the active layer 103. While the photonic crystal may have any lattice pattern, it is exemplarily depicted as having a square shape here as being easy to design. The lattice constant of the photonic crystal is equal to the wavelength of the light generated in the active layer 103.

Assume that light 201 of a wavelength indicated with an arrow in FIG. 4A is generated. When the photonic crystal has a lattice constant λ, the light 201 is diffracted in directions at 90° or 180° as illustrated in FIG. 4B and thus diffracted light beams 2021 and 2022 are generated. The diffracted light beams 2021 and 2022 are in turn diffracted in directions at 90° or 180° as illustrated in FIG. 4C and thus diffracted light beams 2031 and 2032 are generated. It can be seen in FIG. 4C that the diffracted light beams 2021 and 2032, and the diffracted light beams 2022 and 2032 interfere with each other, each forming standing waves. Thus, repeated diffraction at 90° and 180° and interference between the diffracted light beams generate standing waves along the crystal directions inside the photonic crystal. As a result, the light is trapped in the active layer 103 and light resonance occurs therein.

While FIGS. 4A to 4C show diffraction within a plane having a photonic crystal formed therein, it can be easily understood that constructive interference also occurs in a direction vertical to the photonic crystal surface. As a result, the light that has been trapped in the plane and resonated is emitted as a laser beam in the normal direction of the plane.

Figure 5A:
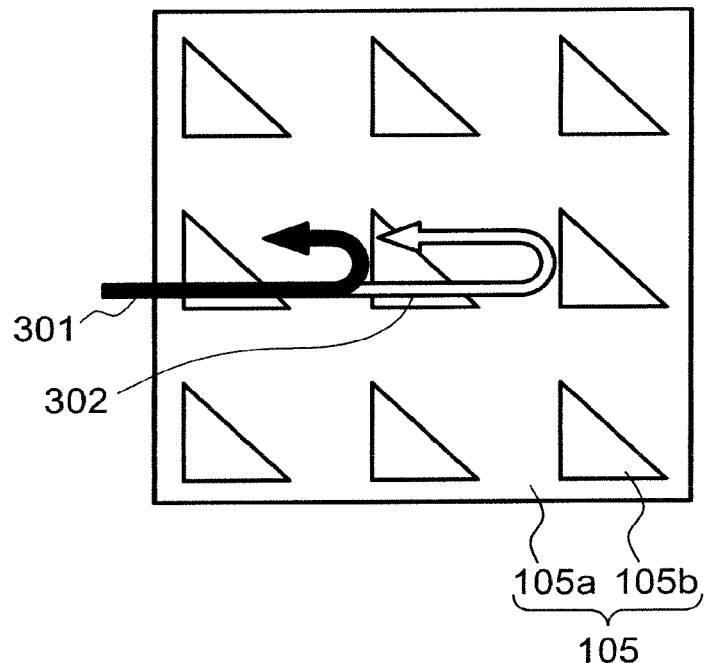
FIG. 5A is a diagram illustrating the in-plane resonance of light occurring inside a photonic crystal layer.
Figure 5B:
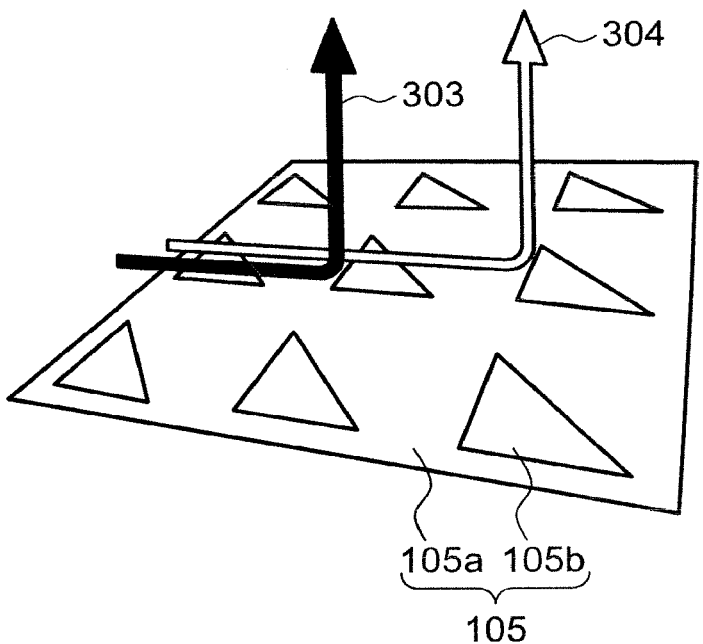
FIG. 5B is a diagram illustrating the surface-normal emission of light occurring inside a photonic crystal layer.

FIG. 5A corresponds to FIG. 9C and illustrates in-plane resonance of light. Diffracted light beams 301 and 302 having an optical path difference equal to twice the wavelength λ interfere with each other. In FIGS. 4A to 4C, the holes 105b are depicted as having a true circular shape as described, while they are depicted as having a triangular shape in FIG. 5A. It has been found out that the beam quality is improved when the holes 105b have a triangular shape as compared to when they have a true circular shape. FIG. 5B illustrates emission of the above-mentioned light in the surface-normal direction. Diffracted light beams 303 and 304 having an optical path difference equal to the wavelength λ interfere with each other.

Light beams are emitted in both surface-normal directions (two directions) from a PCSEL element. In an application where a light beam needs to be output in only one direction, the PCSEL element may be configured such that the light beam is emitted only from the front side through the light reflection at the backside electrode 120 as in the PCSEL element described above.

[Increasing Brightness of Light Beam]

If the laser module 10 is to be used for material processing (in particular, metal cutting process), the light beam for irradiation to a workpiece preferably have a high brightness. Hence, a method for increasing the brightness of the light beam 15 emitted from the fiber will be described below.

In the following description, as illustrated in FIG. 1, $F_L$ represents the arrangement pitch of the laser elements 1, $d_p$ represents the aperture size (radius) of the laser element 1 in the light-emitting surface, $d_e$ represents the aperture size (radius) of the concave lens array 3, $d_c$ represents the aperture size (radius) of the collimating lens array 4, $d_f$ represents the core size (radius) of the optical fiber 6, and $θ_i$ represents the convergence angle of the light beam 14. The arrangement pitch $P_L$ of the laser elements 1 is twice (or substantially twice) the aperture size $d_c$ of the collimating lens array 4. The convergence angle $θ_i$ is expressed by the following equation (1) using the arrangement pitch $P_L$, where N is the number of laser elements 1 positioned on a diagonal line of the hexagonal lattice (see FIG. 2), and f is the focal length of the condenser lens 5.

$$θ_i ≈ \frac{N \cdot P_L}{2f} \quad (1)$$

In one example, the arrangement pitch. $P_L$ is about 2 mm, the aperture size $d_p$ is about 0.1 mm, the aperture sizes $d_e$ and are about 1 mm, the spacing between the laser elements 1 and the concave lens array 3 is about 10 mm, the focal length of (each concave lens of) the concave lens array 3 is about 10 mm, the spacing between the concave lens array 3 and the collimating lens array 4 is about 40 mm, the focal length of (each collimating lens of) the collimating lens array 4 is about 50 mm, the spacing between the collimating lens array 4 and the center of the condenser lens 5 is about 10 mm, the focal length f of the condenser lens 5 is about 40 mm, and the distance between the center of the condenser lens 5 and the incident end of the optical fiber 6 is about 40 mm. The spacing between the collimating lens array 4 and the condenser lens 5 preferably has a minimum length, possibly about 0 mm.

The brightness $B_o$ of the light beam 15 at the exit end of the fiber is expressed by the following equation (2), provided losses are ignored, where $P_0$ is the average power output of the light beam 11 emitted from one laser element 1, M is the number of laser elements 1, $θ_o$ is the divergence angle of the light beam 15 at the exit end of the fiber, and $w_o$ is the beam width.

$$B_o = \frac{M \cdot P_0}{π^2 θ_o^2 w_o^2} \quad (2)$$

To increase the brightness $B_o$ at the exit end of the fiber, the divergence angle $θ_o$ and the beam width $w_o$ may be decreased, increasing the convergence of the light beam.

The total number N of the laser elements 1 can be expressed by the following equation (3) using the number N of laser elements 1 on a diagonal line.

$$M = \frac{3N^2 + 1}{4} \quad (3)$$

If the optical fiber 6 has a bent portion or the like, the light beam that travels inside the fiber undergoes mode coupling inside the fiber, so that, light incident on the fiber end with a low-order mode will be emitted from the fiber end with contain a high-order mode. Namely, the light beam will be emitted at a maximum permissible divergence angle (NA) of the optical fiber 6. When the laser module 10 is used for material processing, the optical fiber 6 has a length of about several meters to ten plus several meters. While this is short for optical communication applications, the optical fiber 6 in use typically includes a bent portion. Therefore, the divergence angle $θ_o$ is considered to be equal (or substantially equal) to an angle $sin^{-1}NA$ corresponding to the number of apertures NA, and the beam width $w_o$ is considered to be equal (or substantially equal) to the core diameter $d_f$ of the optical fiber 6. To increase the brightness $B_o$ at the exit end of the fiber, the core diameter $d_f$ of the optical fiber 6 and the number of apertures NA may be decreased.

In order to decrease the core diameter $d_f$ of the optical fiber 6 and the number of apertures NA, the convergence angle $θ_i$ of the light beam 14 and the beam width $w_f$ at the incident end of the fiber are required to be reduced.

Figure 6A:
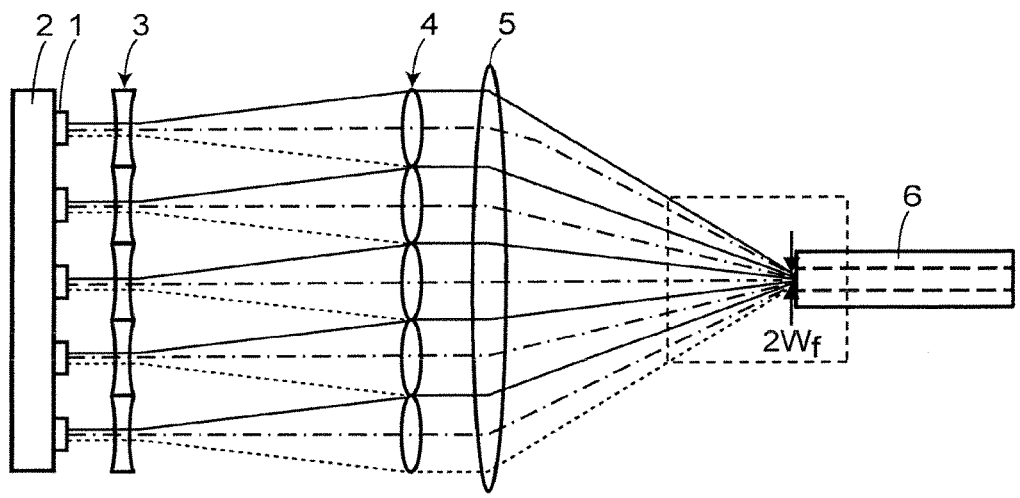
FIG. 6A is a diagram illustrating light beams overlapping each other at the incident end of a fiber.
Figure 6B:
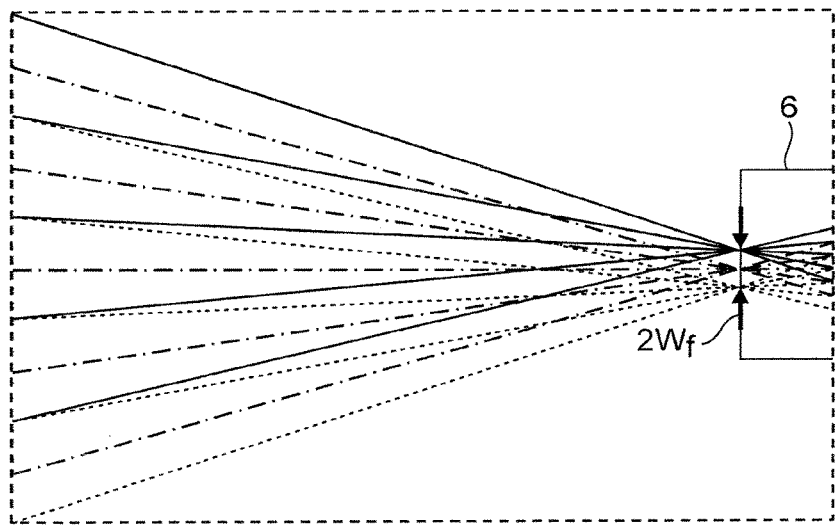
FIG. 6B is a partial enlarged view of FIG. 6A.

FIGS. 6A and 6B are diagrams illustrating the light beams 14 overlapping each other at the incident end of the fiber. FIG. 6B is an enlarged view of the part encircled with a broken line in FIG. 6A. In the drawings, among the outlines that define the beam width of light beams each corresponding to the ones emitted from each of the laser elements 1, outlines on the upper side with respect to the optical axis are depicted by solid lines, and remaining outlines on the lower side by broken lines. As illustrated in FIGS. 6A and 6B, the light beams 14 each corresponding to the ones emitted from each of the laser element s1 overlap at the same position at the incident end of the fiber, so that the beam width of the overlapping light beams gets equal to the beam width $w_f$ of each light beam 14. In the drawings, $2w_f$ represents the beam diameter at the fiber incident end of the light beam.

Here, the beam width $w_f$ at the fiber incident end is expressed by the following equation (4), where $w_c$ is the beam width of the light beam 12 incident on the collimating lens array 4, and $\lambda$ represents wavelength of the light beam 12.

$$w_f = \left\{ \left( \frac{\pi \cdot w_c}{\lambda \cdot f} \right)^2 + \left( \frac{1}{w_c} \right)^2 \right\}^{-\frac{1}{2}} \quad (4)$$

Equation (4) generates values that monotonically decrease in the range expressed by the following equation (5).

$$w_c \geq \sqrt{\frac{\lambda \cdot f}{\pi}} \quad (5)$$

For example, given that $\lambda=0.94$ μm and f=40 mm, Equation (4) generates monotonically decreasing values in the range where 0.11 mm, as can be calculated from Equation (5).

Namely, increasing the beam width $w_c$ at the position of the collimating lens array 4 in this range reduces the beam width $w_f$ at the fiber incident end.

The maximum light-receiving angle $\lambda_{max}$, (=$\sin^{-1}$NA) of the optical fiber 6 needs to be equal to or larger than the convergence angle $\theta_i$ expressed by Equation (1), while the core diameter $d_f$ needs to be equal to or larger than the beam width $w_f$ at the fiber incident end expressed by Equation (4). When, however, $\theta_i$ and $w_f$ are too large, it is considered that mode coupling will occur inside the optical fiber 6 as mentioned above, leading to reduction of the brightness $B_o$ at the fiber exit end. The brightness $B_o$ will have the highest value when the maximum light-receiving angle $\theta_{max}$ of the optical fiber 6 equals to the convergence angle $\theta_i$, and the core diameter $d_f$ equals to the beam width $w_f$.

Through a calculation of a product of the beam width and the divergence angle of the light beam 15 at the fiber exit end, the beam parameter product (BPP), which qualifies the beam quality, is obtained. BPP is expressed by the following equation (6) from Equations (1) and (4).

$$BPP = \theta_i \cdot w_f = \frac{N \cdot P_L}{2f} \left\{ \left( \frac{\pi \cdot w_c}{\lambda \cdot f} \right)^2 + \left( \frac{1}{w_c} \right)^2 \right\}^{-1/2} \quad (6)$$

The brightness $B_i$ of the light beam 14 at the fiber incident end is calculated from the following equation (7).

$$B_i = \frac{M \cdot P_0}{\pi^2 \theta_i^2 w_f^2} = \frac{3N^2 + 1}{N^2} \frac{P_0 \cdot f^2 \left( \left( \frac{\pi \cdot w_c}{\lambda \cdot f} \right)^2 + \left( \frac{1}{w_c} \right)^2 \right)}{\pi^2 P_L^2} \quad (7)$$

When N is sufficiently larger than 1 in Equation (7), the brightness $B_i$ at the fiber incident end gets independent on N and expressed substantially by the following equation (8).

$$B_i = \frac{3P_0 \cdot f^2 \left( \left( \frac{\pi \cdot w_c}{\lambda \cdot f} \right)^2 + \left( \frac{1}{w_c} \right)^2 \right)}{\pi^2 P_L^2} \quad (8)$$

As mentioned above, the brightness $B_o$ at the fiber exit end will have a highest value when the maximum light-receiving angle $\theta_{max}$ of the optical fiber 6 equals to the convergence angle $\theta_i$, and the core diameter $d_f$ equals to the beam width $w_f$. With losses inside the optical fiber 6 being ignored, the brightness $B_o$ at the fiber exit end equals to the brightness $B_i$ at the fiber incident end. That is, by increasing the brightness $B_i$ at the fiber incident end, the brightness $B_o$ at the fiber exit end can be increased.

The brightness $B_i$ at the fiber incident end expressed by Equation (8) is monotonically increasing in the range expressed by Equation (5). It should be noted, however, that since the aperture size $d_c$ of the collimating lens array 4 has a predetermined value, when the beam width $w_c$ is made too large, the ratio of components in the light beams 13 incident on the non-aperture areas of the collimating lens array 4 and hence not passing through the apertures 41 will increase. As a result, the brightness $B_1$ will decrease. It is possible to enlarge the aperture size $d_c$ in order to prevent reduction of the brightness $B_i$. However, it can be seen from Equation (8) that the arrangement pitch $P_L$ of the laser elements 1 will then be larger as well, anyway decreasing the brightness $B_i$.

As such, it is not preferable to simply increase the beam width $w_c$ because it is limited by the aperture size $d_c$. In order to determine an optimal size of the beam width $w_c$, it is necessary to take into consideration the influence via diffraction and the like generated by the non-aperture areas of the collimating lens array 4.

Embodiment 1 is directed to the concept of increasing the brightness $B_i$ at the fiber incident end, which in turn increases the brightness $B_o$ at the fiber exit end. This is accomplished by the process of optimizing the ratio of energy of the light beam passing through the apertures 41 to the energy of the light beam 12 incident on the collimating lens array 4 (the rate is hereinafter referred to as energy transmission rate) through optical simulation. The energy transmission rate can be optimized by the process of adjusting the parameters such as the arrangement pitch $P_L$, the aperture size $d_p$, the aperture size $d_e$, the aperture size $d_c$, the spacing between the laser elements 1 and the concave lens array 3, the focal length of the concave lens array 3, the spacing between the concave lens array 3 and the collimating lens array 4, the focal length of the collimating lens array 4, and so on.

Figure 7:
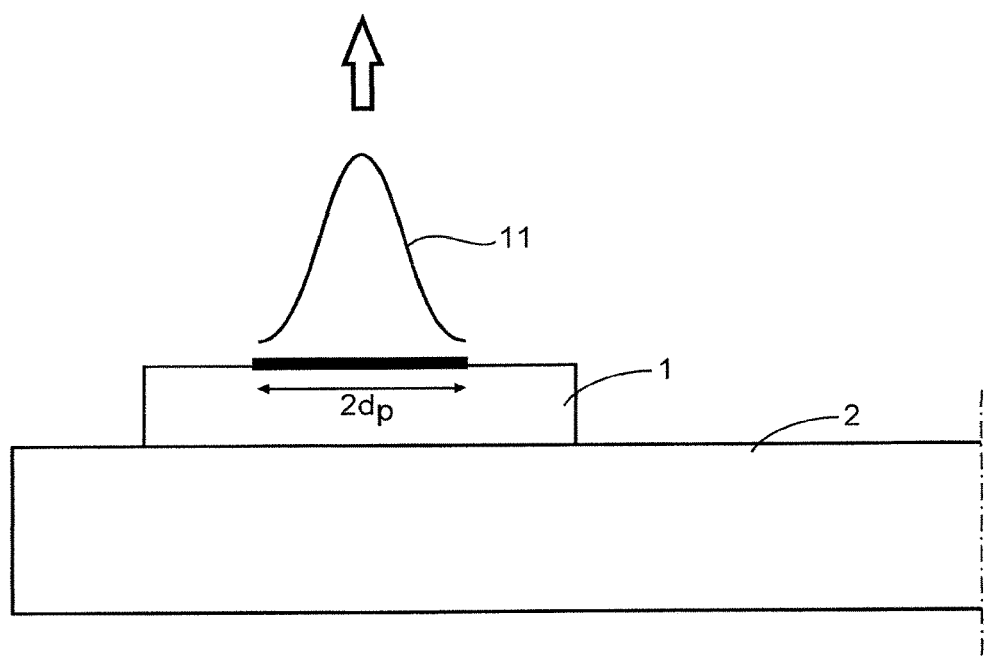
FIG. 7 is a diagram illustrating a Gaussian-shaped light beam emitted from a light-emitting surface of a laser element.

FIG. 7 is a diagram illustrating a Gaussian-shaped light beam output from the light-emitting surface having the aperture size of $d_p$ of the laser element 1. Reference sign 11 in the drawing indicates the beam profile of the light beam output from the laser element 1, and the arrow indicates the output direction of the light beam 11.

Since the laser element 1 is a surface-emitting laser element, a substantially Gaussian-shaped, single-mode light beam 11 of high convergence and high quality can be generated. In particular, with the use of a PCSEL element as the laser element 1, the divergence angle of the light beam 11 can be further reduced, so that the beam width at the position of the concave lens array 3 can be made sufficiently smaller than the aperture size $d_e$. Accordingly, the influence of diffraction, etc. generated by the non-aperture areas of the concave lens array 3 is small enough to be substantially ignored. As such, the light beam 12 incident on the collimating lens array 4 has a Gaussian-shaped (or substantially Gaussian-shaped) beam profile.

Figure 8A:
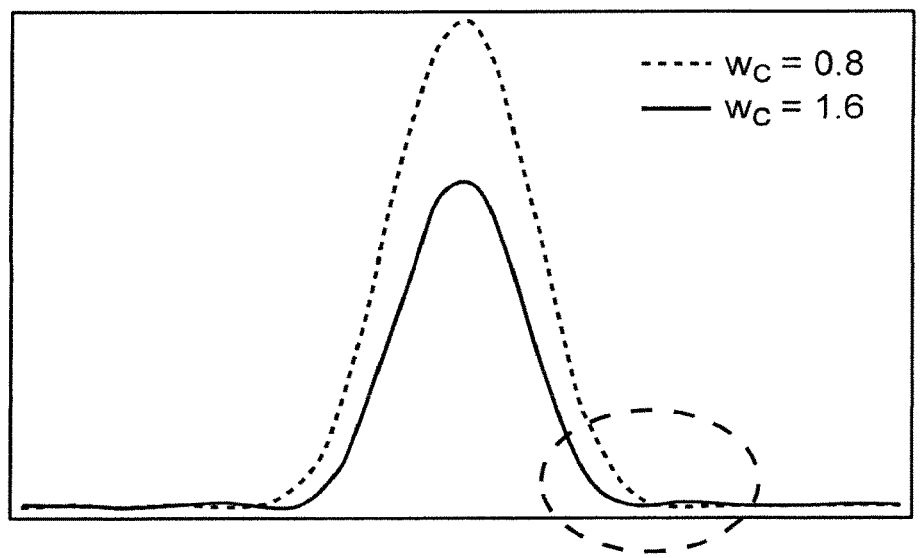
FIG. 8A is a diagram illustrating the beam profile of light beams at the incident end of the fiber.
Figure 8B:
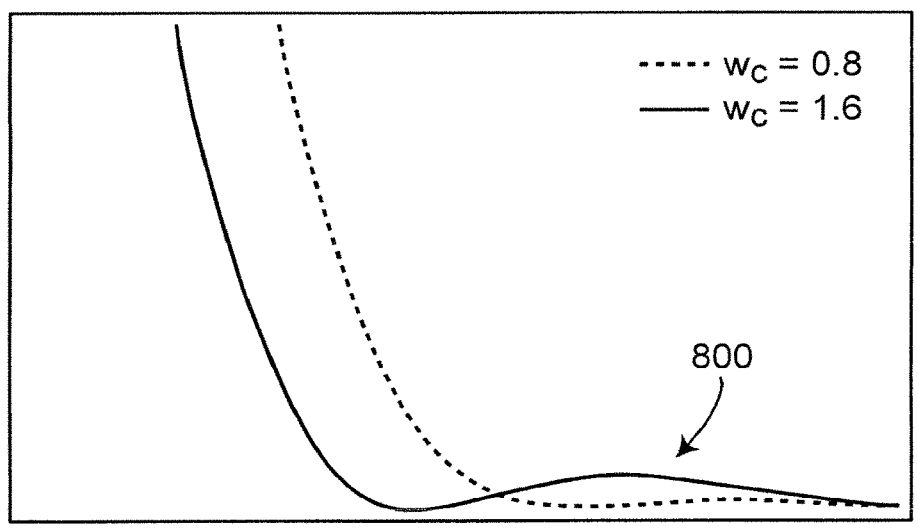
FIG. 8B is a partial enlarged view of FIG. 8A.

FIGS. 8A and 8B are diagrams illustrating a beam profile of the light beam 14 at the fiber incident end. FIG. 8B is an enlarged view of part encircled with a broken line in FIG. 8A. In FIGS. 8A and 8B, the beam profile having the beam width $w_c$ of 1.6 mm is depicted by a solid line, and the beam profile having the beam width $w_c$ of 0.8 mm is depicted by a broken line. To obtain FIGS. 8A and 8B, simulation was performed assuming that the aperture size of the collimating lens array 4 was 1 mm.

As illustrated in FIGS. 8A and 8B, when the beam width $w_c$ is larger ($w_c$=1.6 solid line), the overall intensity is lower as compared to when the beam width $w_c$ smaller ($w_c$=0.8 mm: broken line), because of diffraction, etc. of the light beam at the non-aperture areas of the collimating lens array 4. When the beam width $w_c$ is larger, the beam profile is to include a side lobe as indicated with arrow 800 in FIG. 8B, and deviates from an ideal Gaussian shape.

Figure 9:
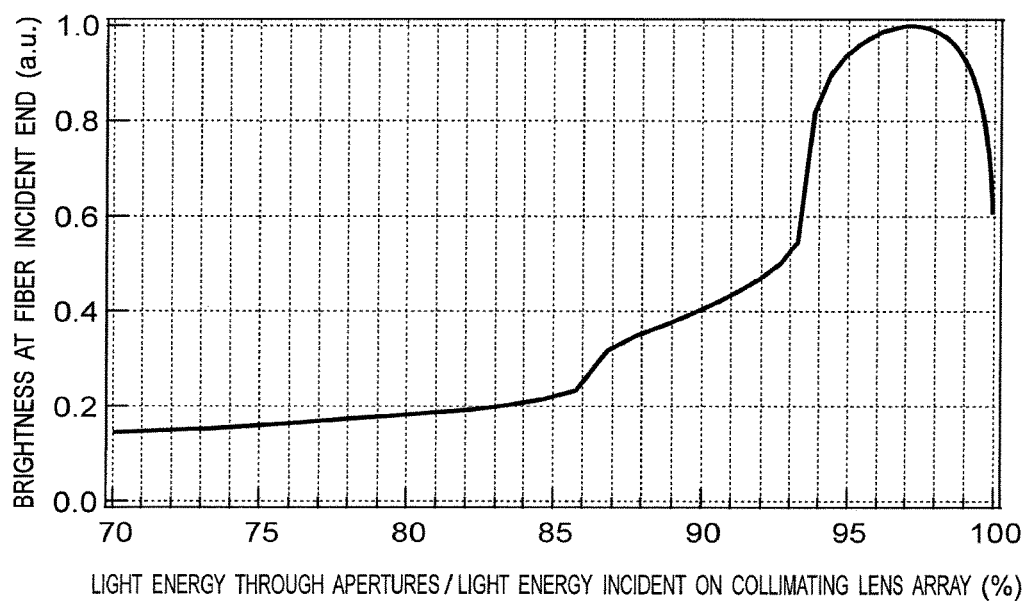
FIG. 9 is a graph for explaining a method of increasing the brightness of light beams at the exit end of the fiber according to Embodiment 1 of the present invention.

FIG. 9 is a graph for explaining a method for increasing the brightness $B_o$ of the light beam 15 at the exit end of the fiber according to Embodiment 1 of the present invention. A value on the horizontal axis of the graph represents the ratio (i.e., energy transmission rate) of energy of the light beam 13 passing through the apertures 41 to the energy of the light beam 12 incident on the collimating lens array 4. An increase in the energy transmission rate may be attributed to a decrease in the beam width relative to the aperture size $d_c$ of the collimating lens array 4. A value on the vertical axis of the graph represents the brightness $B_i$ of the light beam 14 at the fiber incident end. To obtain the graph of FIG. 9, simulation was performed assuming that the light beam 12 incident on the collimating lens array 4 has a Gaussian-shaped beam profile. It should be noted, however, that even though the beam profile is slightly deviated from the Gaussian shape, similar simulation results can be obtained.

In general, a complex amplitude distribution $u_2(x_2)$ obtained after a light beam with a complex amplitude distribution $u_1(x_1)$ has passed through an optical system with a ray matrix ABCD, is expressed by the following equation (9), where $\lambda_0$ is the wavelength of the light beam, a is the calculation area, and $L_0$ is the optical path length.

$$u_2(x_2) = e^{-jkL_o} \sqrt{\frac{j}{B\lambda_o}} \int_{-a}^{+a} u_1(x_1) \exp\left[-j\frac{\pi}{B\lambda_o}(Ax_1^2 - 2x_1x_2 + Dx_2^2)\right]dx_1 \quad (9)$$

The simulation in FIG. 9 was performed using the two-dimensionalized Equation (9). In order to take into consideration the influence of diffraction, etc. generated by the non-aperture areas on the collimating lens array 4, the complex amplitude distribution $u_1(x_1)$ was assumed to be a complex Gaussian distribution, and the ends thereof were cut for the calculations.

Figure 10A:
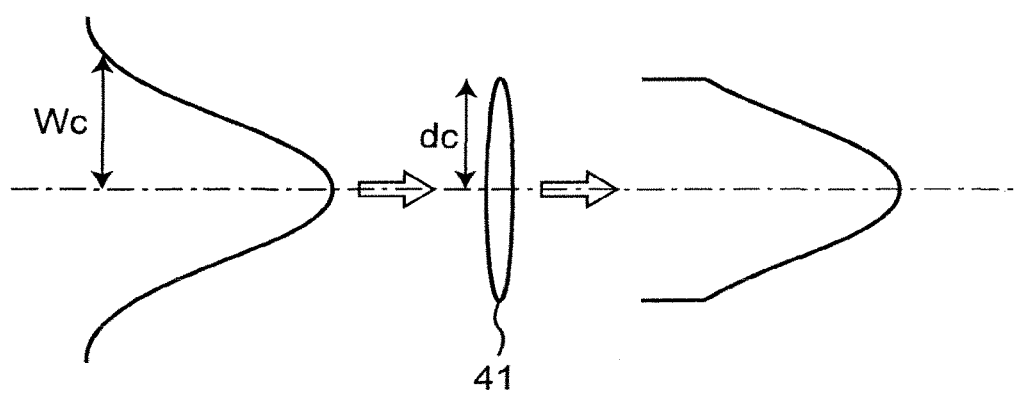
FIG. 10A is a diagram for explaining an optical simulation according to Embodiment 1 of the present invention.
Figure 10B:
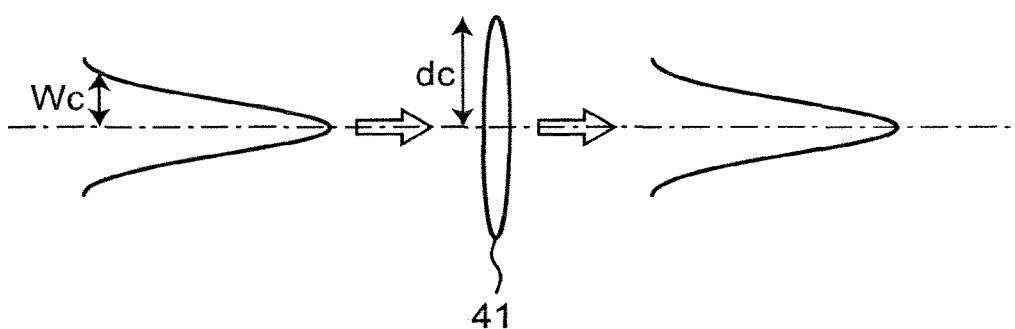
FIG. 10B is a diagram for explaining an optical simulation according to Embodiment 1 of the present invention.

Referring to FIGS. 10A and 10B, the results of the above-noted simulation will be further explained. FIGS. 10A and 10B illustrate beam profiles of a light beam entering one aperture 41 in the collimating lens array 4 and a light beam output from the aperture 41, respectively.

FIG. 10A shows that a light beam having a beam width larger than the aperture size $d_c$ of the collimating lens array 4 enters the collimating lens array 4. The beam profile of the light beam output from the collimating lens array 4 is different from the (substantially Gaussian-shaped) beam profile of the light beam entering the collimating lens array 4 since the ends of the profile are cut off. FIG. 10A is about the area in the graph of FIG. 9 where the value of the horizontal axis is not greater than 94.0%. In this example, a side lobe appears in the beam profile due to diffractive spreading and hence the beam width of the light beam at the fiber incident end is increased (see, for example, arrow 800 in FIG. 8B).

It can be said that FIG. 9 indicates that when the energy transmission rate (represented in the horizontal axis of the graph) is not greater than 94.0%, the brightness $B_i$ of the light beam at the fiber incident end is reduced because of a decrease in energy resulting from the cutting of the beam profile ends and because of diffractive spreading of the beam width.

Meanwhile, FIG. 10B shows that a light beam having a beam width $w_c$ smaller than the aperture size d of the collimating lens array 4 enters the collimating lens array 4. The beam profile of the light beam output from the collimating lens array 4 is substantially the same as that of the light beam entering the collimating lens array 4 since the ends of the profile are not cut off. FIG. 10B is about the area in the graph of FIG. 9 where the value of the horizontal axis is not less than 99.5%. Here, the light beam with a small beam width enters the downstream condenser lens 5, as a result of which the beam width (condensed spot diameter) at the fiber incident end is increased.

It can be found that FIG. 9 indicates that while the energy transmission rate (a value on the horizontal axis of the graph) of larger than 99.5% can minimize a decrease in light beam energy, it cannot sufficiently decrease the beam width at the fiber incident end, reducing the brightness $B_i$ of the light beam 14 at the fiber incident end.

As such, it can be seen that the energy transmission rate in the range of 94.0% to 99.5% inclusive can achieve a high brightness $B_i$. It is demonstrated in FIG. 9 that, when the energy transmission rate is in the range of 94.0% to 99.5% inclusive, a brightness is achieved of about 0.8 times or more the maximum brightness $B_i$ with the energy transmission rate of about 97%.

Whether or not a finished product of a laser module 10 has an energy transmission rate in the range of 94.0% to 99.5% inclusive can be determined by the measurement of an energy at a position immediately after the collimating lens array 4, relative to the energy measured at the position immediately before the collimating lens array 4 taken as 100%. The light beam energy can be measured using e.g. a laser power meter that utilizes piezoelectric conversion.

As demonstrated above, an increase in the energy transmission rate represented by the horizontal axis of FIG. 9 leads to a decrease in beam width w at the position of the collimating lens array 4. The energy transmission rate larger than 99.5% leads to the beam width falling in the monotonically increasing range of the brightness $B_i$ (at the fiber incident end) expressed by Equation (5), which means that the brightness $B_i$ expressed by Equation (8) decreases in this range.

On the other hand, a decrease in the energy transmission rate represented by the horizontal axis of FIG. 9 leads to an increase in beam width $w_c$ at the position of the collimating lens array 4. The energy transmission rate smaller than 94%, for example, leads to the beam width $w_f$ at the fiber incident end having an increased value due to the influence of diffraction, etc. generated by the non-aperture areas on the collimating lens array 4. This means that the brightness $B_i$ expressed by Equation (8) decreases.

In order to increase the brightness $B_i$ and $B_o$, it is preferable that the energy transmission rate has a higher value. Technically, however, it is impossible to achieve a 100% energy transmission rate because of losses by diffraction and the like generated by the non-aperture areas on the collimating lens array 4. When the energy of the light beam 13 that has passed through the apertures 41 is regarded as 100%, the laser module 10 according to Embodiment 1 is adjusted for allowing a light beam of about 98% of that energy to be incident on the optical fiber 6. When the energy of the light beam 12 entering the collimating lens array 4 is regarded as 100% and a light beam of 94.0% energy has passed through the apertures 41, about 92% or more of the energy of the light beam 12 can be incident on the optical fiber 6 and utilized.

According to Embodiment 1, a light beam with an energy in the range of 94.0% to 99.5% inclusive, relative to the energy of the light beam 12 entering the collimating lens array 4 being taken as 100%, has passed through the apertures 41, increasing the brightness $B_o$ of the light beam 15 at the fiber exit end, which consequently enables a laser module 10 suitable for material processing to be obtained.

Embodiment 2

Figure 11:
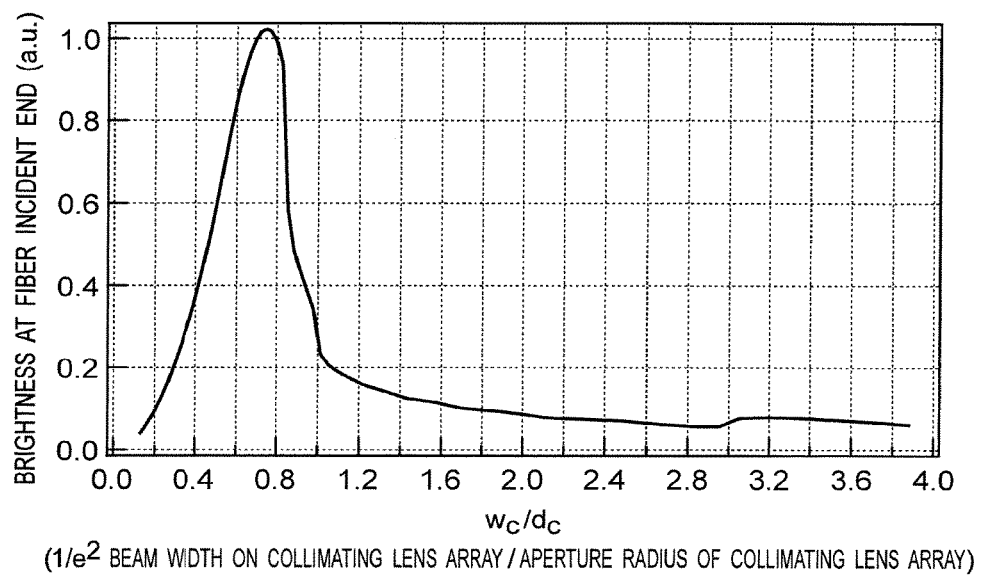
FIG. 11 is a graph for explaining a method of increasing the brightness of light beams at the exit end of the fiber according to Embodiment 2 of the present invention.

FIG. 11 is a graph for explaining a method of increasing the brightness $B_o$ of the light beam 15 at the exit end of the fiber according to Embodiment 2 of the present invention. A value on the horizontal axis of the graph represents the ratio $w_c/d_c$ of the beam width (Gaussian beam radius) $w_c$ at the position of the collimating lens array 4 to the aperture size $d_c$ of the collimating lens array 4. A value on the vertical axis of the graph represents the brightness $B_i$ of the light beam 14 at the fiber incident end.

As described Embodiment 1 is about optimizing the ratio (i.e., energy transmission rate) of energy of the light beam passing through the apertures 41 to the energy of the light beam 12 entering the collimating lens array 4 via optical simulation. In Embodiment 2, it is intended to increase the brightness $B_i$ at the fiber incident end, which in turn increases the brightness $B_o$ at the fiber exit end, by optimizing the ratio $w_c/d_c$ referred to above via the same optical simulation. Embodiment 2 is different from Embodiment 1 only in the target to be optimized, and shares the basic structure with Embodiment 1.

Figure 12A:
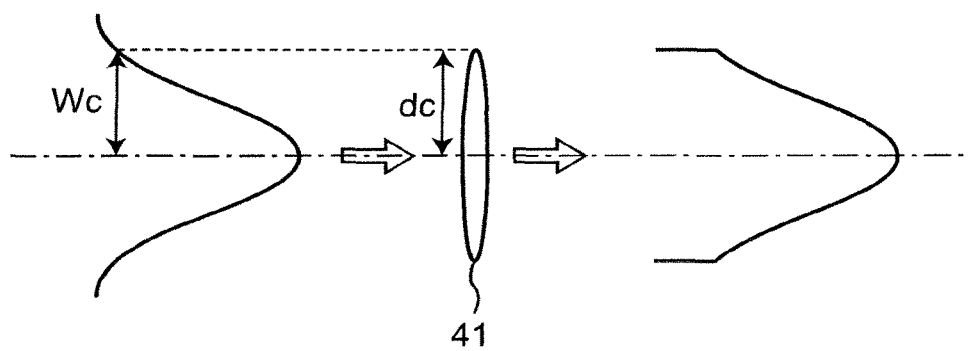
FIG. 12A is a diagram for explaining an optical simulation according to Embodiment 2 of the present invention.
Figure 12B:
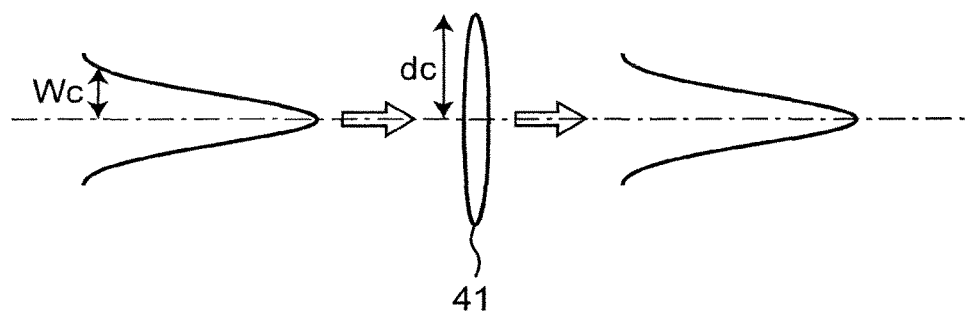
FIG. 12B is a diagram for explaining an optical simulation according to Embodiment 2 of the present invention.

Referring to FIGS. 12A and 12B, the results of the simulation in Embodiment 2 will be further explained. FIGS. 12A and 12B respectively correspond to FIGS. 10A and 10B and illustrate beam profiles of a light beam 12 entering one aperture 41 in the collimating lens array 4 and a light beam 13 output from the aperture 41.

In FIG. 12A, a light beam having the same beam width (Gaussian beam radius) as that of the aperture size $d_c$ of the collimating lens array 4 enters the collimating lens array 4. The beam profile of the light beam output from the collimating lens array 4 is thus different from the (substantially Gaussian-shaped) beam profile of the light beam entering the collimating lens array 4 since the ends of the profile are cut off. FIG. 12A shows that the value of the horizontal axis is 1.0 in the graph of FIG. 11. Since a side lobe appears in the beam profile due to diffractive spreading, the beam width of the light beam at the fiber incident end is increased (see, for example, arrow 800 in FIG. 8B).

It can be found that FIG. 11 indicates that when the ratio $w_c/d_c$ (a value on horizontal axis of the graph) is larger (i.e., closer to 1.0), the brightness $B_i$ of the light beam 14 at the fiber incident end is reduced because of an energy decrease resulting from the beam profile with the end thereof being cut off and because of diffractive spreading of the beam width.

Meanwhile, in FIG. 12B, a light beam having a beam width $w_c$ smaller than the aperture size d of the collimating lens array 4 enters the collimating lens array 4. The beam profile of the light beam output from the collimating lens array 4 is substantially the same as the beam profile of the light beam entering the collimating lens array 4 since the profile has remaining ends without being cut off. In the embodiment illustrated in FIG. 12B, the light beam with a smaller beam width enters the condenser lens 5, which consequently increase the beam width (i.e. condensed spot diameter) at the fiber incident end.

In Embodiment 1, conditions for achieving a high brightness $B_i$ (i.e. the energy transmission rate being in the range of 94.0% to 99.5% inclusive) were discussed with reference to FIGS. 10A and 10B. FIG. 9 ascertained that, under such conditions, a brightness of about 0.8 times or more the maximum brightness $B_i$ can be achieved. In the same way, the range of the ratio $w_c/d_c$ (from 0.60 to 0.85 inclusive) in FIG. 11 can be adopted as a condition for obtaining a high brightness $B_i$ in Embodiment 2, given that in the range of the ratio $w_c/d_c$, a brightness of about 0.8 times or more the maximum brightness $B_i$ can be achieved.

Whether or not a finished product of a laser module 10 has a ratio $w_c/d_c$ (from 0.60 to 0.85 inclusive) can be determined by the measurement of the beam width at a position immediately before the collimating lens array 4 using, for example, a CCD camera-type laser beam profiler.

According to Embodiment 2, similarly, the brightness $B_o$ of the light beam 15 at the fiber exit end can be increased, which in turn enables a laser module 10 suitable for material processing to be obtained.

Embodiment 3

In Embodiment 3, various parameters (the arrangement pitch $P_L$ of the laser elements 1, the aperture size $d_p$ on the light-emitting surface of the laser elements 1, the aperture size $d_e$ of the concave lens array 3, the aperture size $d_c$ of the collimating lens array 4, the spacing between the laser elements 1 and the concave lens array 3, the focal length of the concave lens array 3, the spacing between the concave lens array 3 and the collimating lens array 4, the focal length of the collimating lens array 4, and so on) may be adjusted so that the value of Element C will be zero in a ray matrix expressed by the following equation (10) defined in a range from the laser elements 1 to the condenser lens 5.

$$\begin{pmatrix} A & B \\ C & D \end{pmatrix} \tag{10}$$

Light beams emitted from the (surface-emitting) laser elements 1 are substantially planar waves, which exit perpendicularly to the substrate surface. Therefore, when Element C of the ray matrix expressed by Equation (10) is zero, the light beams propagate with maintaining their orientations. Accordingly, even if there are slight deviations (e.g., generated due to manufacturing tolerances) in the positions of the laser elements 1, or between the positions and aperture sizes $d_e$ and $d_c$ of the lens arrays 3 and 4, for example, the light beams output from all the laser elements 1 can be input perpendicularly to the condenser lens 5.

In Embodiment 3, the focal length f of the condenser lens 5 is made equal to the distance from the condenser lens 5 to the incident end of the optical fiber 6. Thus, the light beams output from each of the laser elements 1 are converged to the same (or substantially the same) position at the incident end of the optical fiber 6. Therefore, even if there are slight deviations (e.g., generated due to manufacturing tolerances) in the positions of the laser elements 1, or between the positions and aperture sizes $d_e$ and $d_c$ of the lens arrays 3 and 4, for example, the light beams output from all the laser elements 1 can be converged to the same (or substantially the same) position of the condenser lens 5, which enables easier alignment of various optical elements 1 and 3 to 5.

In particular, when a PCSEL element is used as the laser element 1, the light beam being a high-quality planer wave is emitted, thereby further increasing the aperture size $d_p$ on the light-emitting surface. The position separated from the condenser lens 5 by a distance equal to the focal length f of the condenser lens 5 will be the condensed spot position, thereby decreasing the core diameter $d_f$ of the optical fiber 6.

Embodiment 4

Figure 13:
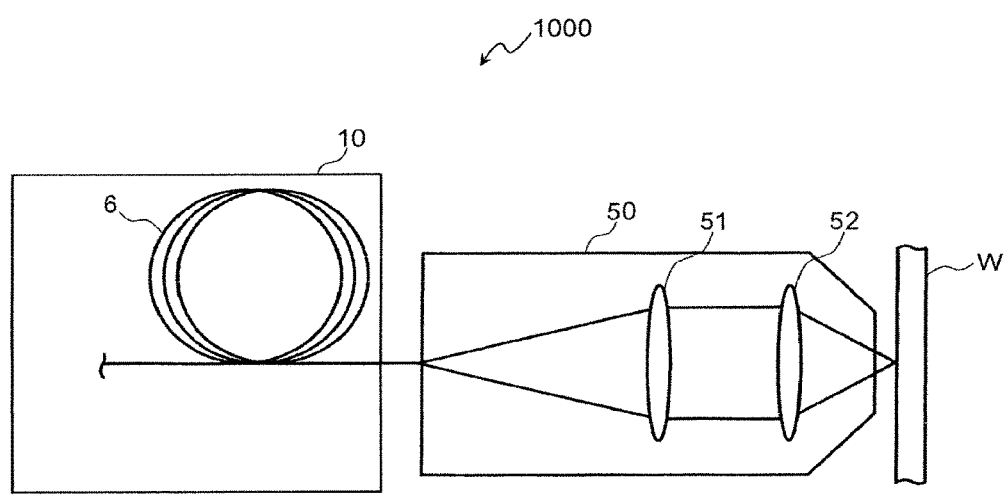
FIG. 13 is a diagram illustrating a configuration of a laser processing apparatus according to Embodiment 4 of the present invention.

FIG. 13 is a diagram illustrating a configuration of a laser processing apparatus according to Embodiment 4 of the present invention. The laser processing apparatus 1000 includes a laser module 10 according to any one of Embodiments 1 to 3, or a laser module 10 having any combination of features derived from Embodiments 1 to 3, and a processing head 50 for irradiating a workpiece W with the light beam 15 output from the optical fiber 6.

The processing head 50 is a hollow tubular member and provided with two processing lenses 51 and 52 therein that render light beams into parallel and converging beams to form a light spot at a processing point on the workpiece W. The distal end of the processing head 50 is formed in a nozzle shape so that it allows the light beams converged by the processing lens 52 to pass through and an assist gas to be supplied toward the workpiece W.

According to Embodiment 4, with the laser module 10 having a brightness of the light beam 15 emitted from the fiber higher than that of conventional lasers, a laser processing apparatus 1000 may be obtained with higher processing precision.

Embodiment 5

Figure 14:
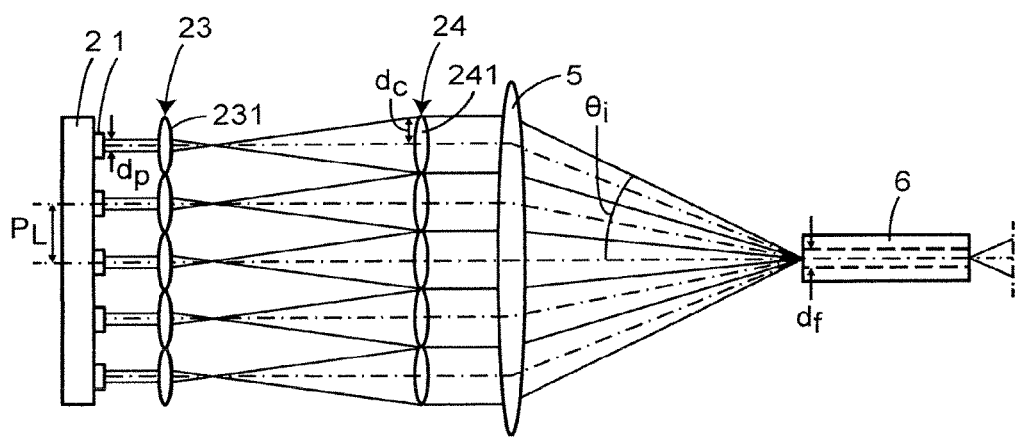
FIG. 14 is a diagram illustrating a configuration of a laser module according to Embodiment 5 of the present invention.

FIG. 14 is a diagram illustrating a configuration of a laser module according to Embodiment 5 of the present invention. In Embodiments 1 to 3, the concave lens array 3 and the collimating lens array 4 are collectively forms the beam expander. In Embodiment 5, as illustrated in FIG. 14, a convex lens array 23 is provided instead of the concave lens array 3, and this convex lens array 23 and a collimating lens array 24 collectively forms the beam expander. The convex lens array 23 and the collimating lens array 24 are arranged such that the converging point is formed between both the lens arrays 23 and 24.

The convex lens array 23 has apertures 231 corresponding to the apertures 31 of the concave lens array 3 illustrated in FIG. 1. The collimating lens array 24 has apertures 241 corresponding to the apertures 41 of the collimating lens array 4 illustrated in FIG. 1.

The laser module 10 according to Embodiment 5 has the same components as those of Embodiments 1 to 3 other than the beam expander. Same reference signs as those used in Embodiments 1 to 3 are used to describe the features of Embodiment 5 and in FIG. 14.

According to Embodiment 5, the similar advantages to those of Embodiments 1 to 3 are obtained with the beam expander different from that of Embodiments 1 to 3.

Embodiment 6

Figure 15:
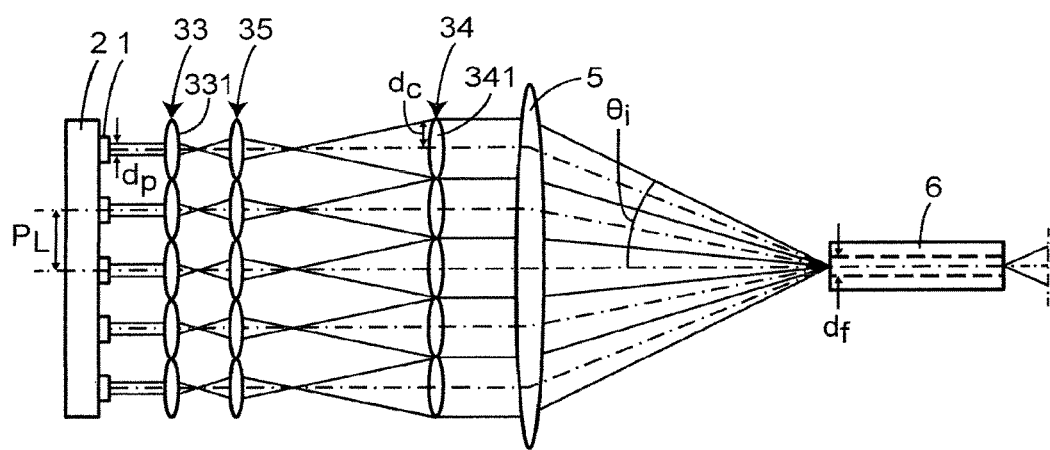
FIG. 15 is a diagram illustrating a configuration of a laser module according to Embodiment 6 of the present invention.

FIG. 15 is a diagram illustrating a configuration of a laser module according to Embodiment 6 of the present invention. In Embodiment 5, two sets of lens arrays, the convex lens array 23 and the collimating lens array 24 collectively form the beam expander. In Embodiment 6, as illustrated in FIG. 15, another convex lens array 35 is provided between a convex lens array 33 and a collimating lens array 34, and these three sets of lens arrays collectively forms the beam expander. The convex lens arrays 33 and 35 are arranged such that the converging point is formed between both the lens arrays 33 and 35. The convex lens array 35 and the collimating lens array 34 are arranged such that the converging point is formed between both the lens arrays 34 and 35.

The convex lens array 33 has apertures 331 corresponding to the apertures 31 of the concave lens array 3 illustrated in FIG. 1. The collimating lens array 34 has apertures 341 corresponding to the apertures 41 of the collimating lens array 4 illustrated in FIG. 1.

The laser module 10 according to Embodiment 6 has the same components as those of Embodiments 1 to 3 and 5 other than the beam expander. Same reference signs as those used in Embodiments 1 to 3 and 5 are used to describe Embodiment 6 and in FIG. 15.

According to Embodiment 6, the similar advantages to those obtained by Embodiments 1 to 3 and 5 are obtained with the beam expander different from that of Embodiments 1 to 3 and 5.

In Embodiment 3, various parameters (the arrangement pitch $P_L$ of the laser elements 1, the aperture size $d_p$ on the light-emitting surface of the laser elements 1, the aperture size $d_e$ of the concave lens array 3, the aperture size $d_c$ of the collimating lens array 4, the spacing between the laser elements 1 and the concave lens array 3, the focal length of the concave lens array 3, the spacing between the concave lens array 3 and the collimating lens array 4, the focal length of the collimating lens array 4, and so on) are adjusted so that the value of Element C will be zero in the ray matrix expressed by Equation (10) from the laser elements 1 to the condenser lens 5. In Embodiment 6, instead of or in addition to this, the various parameters may be adjusted so that Element B will be zero.

With Element B being zero, even if the divergence angle of the light beam emitted form the laser elements 1 is deviated from the designed value, a desired beam width and beam divergence angle can readily be achieved at the position of the condenser lens 5 only by the adjustment of the spacing between the three sets of lens arrays described above.

While the present invention has been described with reference to the above embodiments, the scope of the present invention is not limited to these embodiments. Other embodiments may be configured by any combination of the features of various embodiments. A variety of modifications and improvements may be added to the above embodiments, meaning that there exist numerous variations of the present invention.

DESCRIPTION OF REFERENCE SYMBOLS

1 LASER ELEMENT
2 BASE
3 CONCAVE LENS ARRAY
4 COLLIMATING LENS ARRAY
5 CONDENSER LENS
6 OPTICAL FIBER
10 LASER MODULE
50 PROCESSING HEAD
1000 LASER PROCESSING APPARATUS
$P_L$ ARRANGEMENT PITCH OF LASER ELEMENTS
$d_p$ APERTURE SIZE ON LIGHT-EMITTING SURFACE OF LASER ELEMENTS
$d_e$ APERTURE SIZE OF CONCAVE LENS ARRAY
$d_c$ APERTURE SIZE OF COLLIMATING LENS ARRAY
$\theta_i$ CONVERGENCE ANGLE OF LIGHT BEAM
$d_f$ CORE DIAMETER OF OPTICAL FIBER

The invention claimed is:

1. A laser module comprising:
a plurality of photonic crystal surface-emitting laser elements arranged on a coplanar surface, each of the laser elements being configured to emit a light beam;
a concave lens array configured to enlarge the beam width of the light beam emitted from the laser elements;
a collimating lens array having a plurality of apertures that form collimating lenses to collimate the light beams having the enlarged beam width through the concave lens array;
a condenser lens configured to converge the light beams collimated by the collimating lens array; and
an optical fiber having an incident end on which the light beams converged by the condenser lens are incident and an exit end from which the light beams exit, wherein
the apertures of the collimating lens array are designed to pass light beams in an energy range of from 94.0% to 99.5% inclusive of 100% energy of light beams that are incident on the collimating lens array.

2. The laser module according to claim 1, wherein
the apertures of the collimating lens array are arranged adjacent to each other, and
the photonic crystal surface-emitting laser elements are arranged at a pitch twice as large as the size of each of the apertures of the collimating lens array.

3. The laser module according to claim 1, wherein in a ray matrix expressed by the following expression defined in a range from the plurality of photonic crystal surface-emitting laser elements to the condenser lens, element C is zero, and wherein
a focal length of the condenser lens equals to a distance from a center of the condenser lens to an incident end of the optical fiber $$\begin{pmatrix} A & B \\ C & D \end{pmatrix}.$$

4. The laser module according to claim 3, wherein element B in the ray matrix is zero.

5. The laser module according to claim 1, wherein the concave lens array is disposed immediately after the laser elements.

6. The laser module according to claim 1, wherein each of the photonic crystal surface-emitting laser elements configured to emit a Gaussian-shaped single-mode beam.

7. A laser processing apparatus comprising:
the laser module according to claim 1; and
a processing head for irradiating a workpiece with a light beam output from the optical fiber to a workpiece.

8. A laser module comprising:
a plurality of photonic crystal surface-emitting laser elements arranged on a coplanar surface, each of the laser elements being configured to emit a light beam;
a concave lens array configured to enlarge the beam width of the light beam emitted from the laser elements;
a collimating lens array having a plurality of apertures that form collimating lenses to collimate the light beams having the enlarged beam width through the concave lens array;
a condenser lens configured to converge the light beams collimated by the collimating lens array; and
an optical fiber having an incident end on which the light beams converged by the condenser lens are incident and an exit end from which the light beams exit, wherein
the apertures of the collimating lens array each have a size ranging from 0.6 times to 0.85 times inclusive a Gaussian beam radius of a light beam that is incident on each of the apertures.

9. The laser module according to claim 8, wherein
the apertures of the collimating lens array are arranged adjacent to each other, and
the photonic crystal surface-emitting laser elements are arranged at a pitch twice as large as the size of each of the apertures of the collimating lens array.

10. The laser module according to claim 8, wherein in a ray matrix expressed by the following expression defined in a range from the plurality of photonic crystal surface-emitting laser elements to the condenser lens, element C is zero, and wherein
a focal length of the condenser lens equals to a distance from a center of the condenser lens to an incident end of the optical fiber $$\begin{pmatrix} A & B \\ C & D \end{pmatrix}.$$

11. The laser module according to claim 10, wherein element B in the ray matrix is zero.

12. The laser module according to claim 8, wherein the concave lens array is disposed immediately after the laser elements.

13. The laser module according to claim 8, wherein each of the photonic crystal surface-emitting laser elements is configured to emit a Gaussian-shaped single-mode beam.

14. A laser processing apparatus comprising:
the laser module according to claim 8; and
a processing head for irradiating a workpiece with a light beam output from the optical fiber to a workpiece.

* * * * *